(12) United States Patent
Lee

(10) Patent No.: US 8,143,905 B2
(45) Date of Patent: Mar. 27, 2012

(54) IN-MOULD MOLDING TOUCH MODULE AND METHOD FOR MANUFACTURING THE SAME

(75) Inventor: Min-Yi Lee, Sindian (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

(21) Appl. No.: 13/085,499

(22) Filed: Apr. 13, 2011

(65) Prior Publication Data

US 2011/0186422 A1    Aug. 4, 2011

Related U.S. Application Data

(62) Division of application No. 11/963,795, filed on Dec. 22, 2007, now Pat. No. 7,977,953.

(30) Foreign Application Priority Data

Oct. 23, 2007    (TW) ................. 96139593 A

(51) Int. Cl.
*G01R 27/26*    (2006.01)

(52) U.S. Cl. ....................................... 324/660; 324/658
(58) Field of Classification Search ................... 324/660
See application file for complete search history.

(56) References Cited

U.S. PATENT DOCUMENTS 5,721,666 A * 2/1998 Girard ........................... 361/627

* cited by examiner

*Primary Examiner* — Vincent Q Nguyen
(74) *Attorney, Agent, or Firm* — Gokalp Bayramoglu; Anna Tsang

(57) ABSTRACT

An in-mold molding touch module includes a plastic film, a touch circuit and a molding rind. The plastic film includes an inner surface and an outer surface for handling and touching. At least one region of the inner surface and a corresponding region of the outer surface define a touch area. The touch circuit is arranged on the inner surface in the touch area. The molding rind is integrated on the inner surface by an in-mold injecting mode to contain the touch circuit for forming a one-piece body. In addition, the invention also provides a method for manufacturing an in-mold molding touch module.

15 Claims, 12 Drawing Sheets

IN-MOULD MOLDING TOUCH MODULE AND METHOD FOR MANUFACTURING THE SAME

CROSS-REFERENCE TO RELATED APPLICATIONS

This application is a division of Ser. No. 11/963,795, filed Dec. 22, 2007 now U.S. Pat. No. 7,977,953 by the present inventor, which is incorporated herein by reference.

BACKGROUND OF THE INVENTION

1. Technical Field

The present invention relates to an in-mould molding touch module and a method for manufacturing the same, and more specifically, to a module technology employing an in-mould injecting technology to contain a touch panel having a sensing circuit.

2. Description of the Background

In-mould Touch is a technology deriving from combining an in-mould injecting technology and a manufacturing technology of touch panels.

The in-mould injecting technology in the industry includes an in mold label (IML) technology. A patent WO No. 00/39883 discloses an antenna and a method for manufacturing the same, which employ the IML technology. The technology of the patent discloses inserting a plate having a conducting ink antenna circuit printed thereon into a cavity of a mold, and then injects a molding material into the cavity to manufacture the product containing the embedded antenna circuit therein for protecting the antenna circuit, and for preventing the antenna circuit from fretting and renting. However, the IML technology is not developed to be used to manufacture the touch panel with the in-mould injecting technology in industry.

Relating to touch panels, a technology for using indium tin oxide (ITO) coated on a glass substrate to form a touch sense circuit is public. However, the technology for forming the touch sense circuit is not developed to be used to manufacture the touch panel with the in-mould injecting technology.

Furthermore, the patent WO No. 00/39883 discloses a method for containing the antenna by the IML technology, and fails to disclose a technology for applying the IML to manufacturing an inducing capacitive touch panel. The patent WO No. 00/39883 does also not disclose a technology for using conductive printing ink to manufacturing a touch panel configured for pushing and pressing. There is no relative technology to disclose whether a one-piece touch module, having an ITO and a carrier coating the ITO thereon, may be manufacturing by the in-mould injecting technology.

What is needed is an in-mould molding touch module, which can solve the above problems.

BRIEF SUMMARY OF THE INVENTION

An in-mould molding touch module includes a plastic film, a touch circuit and a molding rind. The plastic film includes an inner surface and an outer surface for handling and touching. At least one region of the inner surface and a corresponding region of the outer surface define a touch area. The touch circuit is arranged on the inner surface in the touch area. The molding rind is integrated on the inner surface by an in-mould injecting mode to contain the touch circuit for forming a one-piece body.

The touch circuit is an inducing capacitive touch circuit made of indium tin oxide (ITO) or a press touch circuit made of conductive printing ink. The outer surface and the inner surface may define a first touch region coated with an inducing capacitive touch circuit and a second touch region coated with a press touch circuit. Therefore, the in-mould molding touch module has a thin thickness, and eliminates a ladderlike thickness and a gap arranged between the joint surfaces. Consequently, the in-mould molding touch module can avoid congregating the dust, and is prone to be thin.

A method for manufacturing an in-mould molding touch module in accordance with another preferred embodiment of the present invention, includes:

(1) providing a plastic film having an inner surface and an outer surface for handling and touching, and at least one region of the inner surface and a corresponding region of the outer surface defining a touch area;

(2) coating an ITO layer on the inner surface in the touch area by a vacuum sputtering mode;

(3) exposing, developing and etching the ITO layer to form an inducing capacitive touch circuit; and (4) inserting the plastic film having the inducing capacitive touch circuit coated thereon into a cavity of an injecting device, and injecting molding material into the cavity to form a molding rind integrated with the inner surface to contain the inducing capacitive touch sense circuit for forming a one-piece body.

The plastic film may be made of a soft rubber film having a heat-resistance capability higher than the temperature in the injecting mold and the vacuum sputtering process, and the ITO layer has heat-resistance capability higher than the temperature in the injecting mold. Thus, the method can be performed favorably, and can simplify the manufacturing processes and decrease the manufacturing time. Furthermore, the inducing capacitive touch circuit can be replaced by a press touch circuit, and the press touch circuit is formed by coating a conductive printing ink by a printing mode. In another embodiment, the plastic film has a first touch region and a second touch region. The inducing capacitive touch circuit is formed in the first touch region, and the press touch circuit is formed in the second touch region. Accordingly, the method is prone to manufacture a touch panel of an electric device having a single sense touch region, and the method has a characteristic of thin design.

Other objects, advantages and novel features of the invention will become more apparent from the following detailed description when taken in conjunction with the accompanying drawings, in which:

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe a preferred embodiment of the present in-mould molding touch module, in detail.

Figure 1:
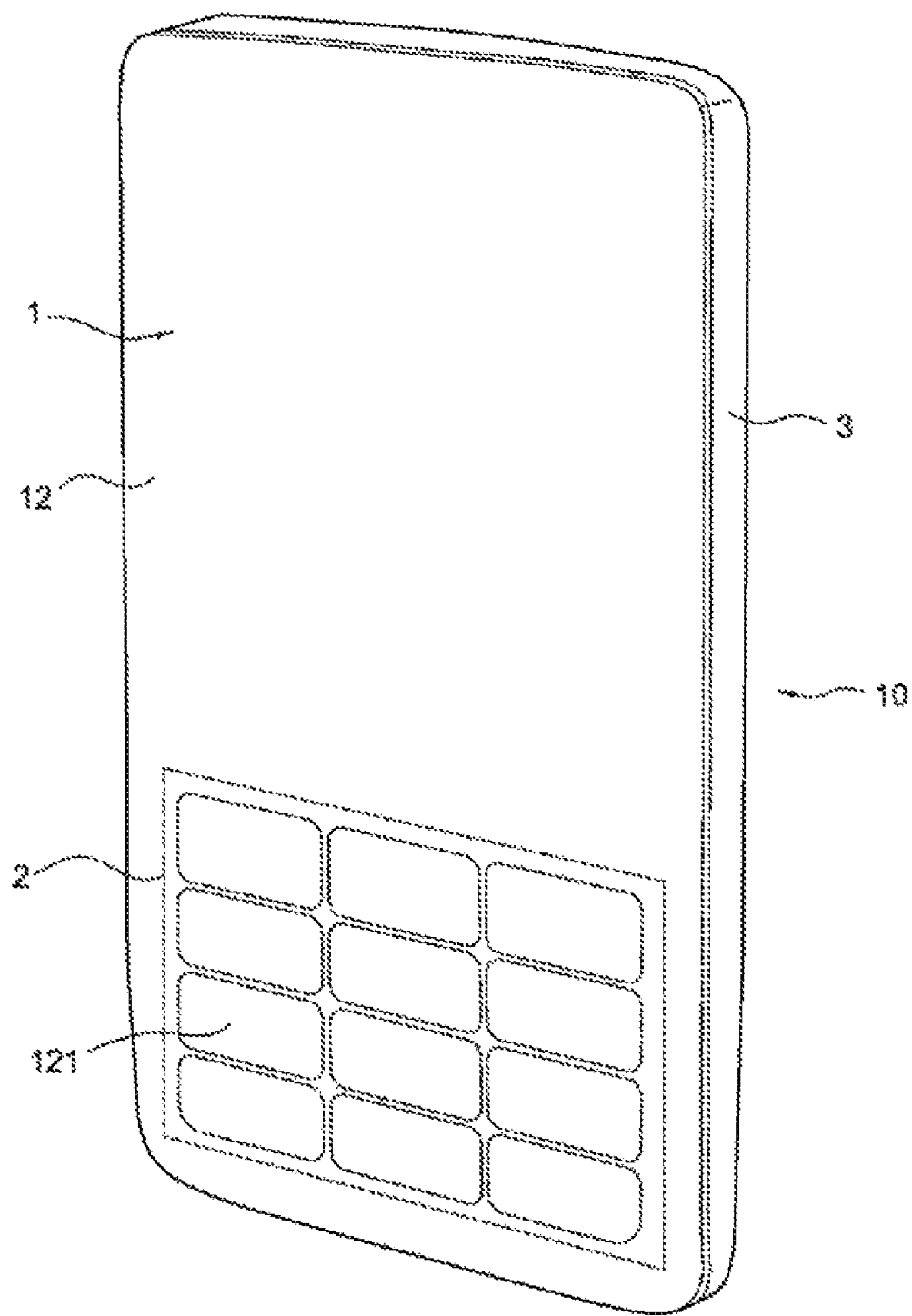
FIG. 1 is a schematic, three-dimensional view of an electronic device having an in-mould molding touch module of a preferred embodiment of the present invention.
Figure 2:
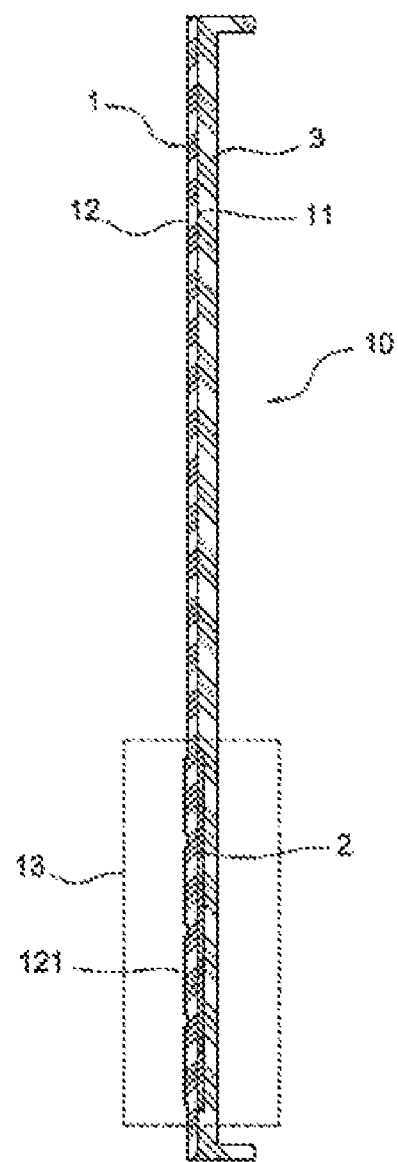
FIG. 2 is a schematic, crossed-view of the in-mould molding touch module in FIG. 1.

As shown in FIGS. 1 and 2, an in-mould molding touch module, in accordance with a preferred embodiment of the present invention, is shown. The in-mould molding, touch module 10 includes a plastic film 1, a touch circuit 2 and a molding rind 3.

Figure 3:
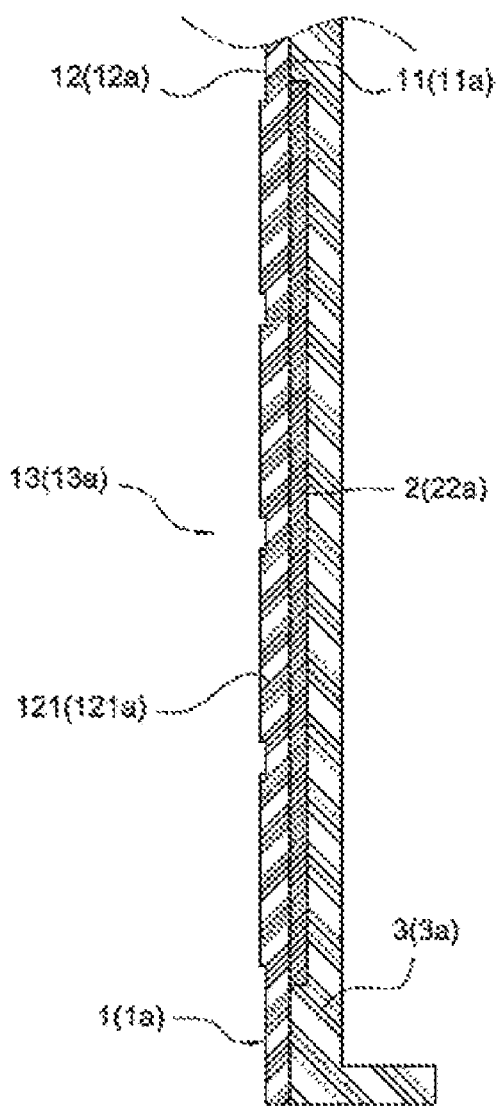
FIG. 3 is a part enlarged view of a touch area in FIG. 2, which shows a plurality of touch members on an outer surface of a plastic film in the touch area.

The plastic film 1 includes an inner surface 11 (as shown in FIG. 3) and an outer surface 12 for handling and touching. A touch region 13 is defined by a region of the inner surface 11 and a corresponding region of the outer surface 12.

The touch circuit 2 is arranged on the inner surface 11 in the touch sense region 13.

The molding rind 3 is integrated on the inner surface 11 by an in-mould injecting mode to contain the touch sense circuit 2 for forming a one-piece body.

Figure 5:
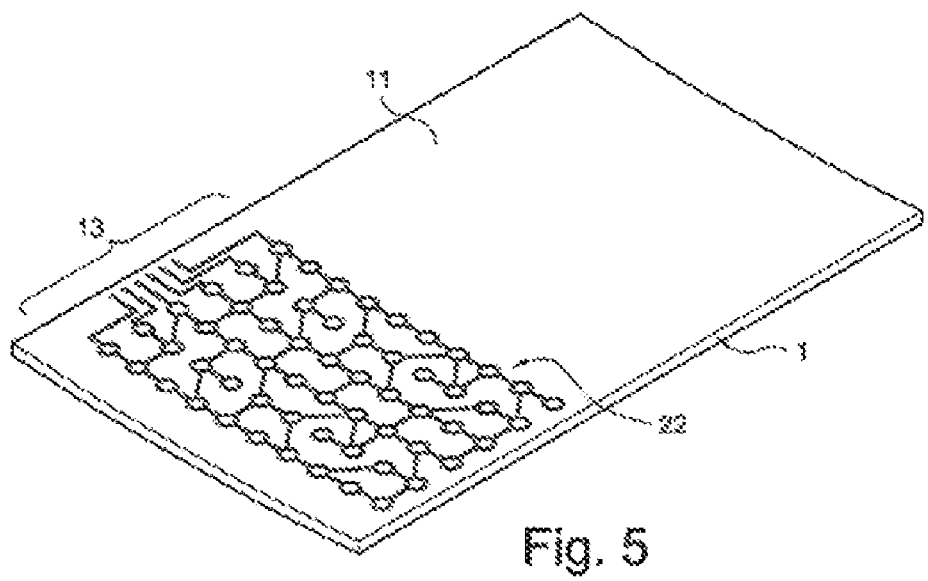
FIG. 5 is another schematic, three-dimensional view showing a press touch circuit formed by etching the conductive printing ink shown in FIG. 4.
Figure 6:
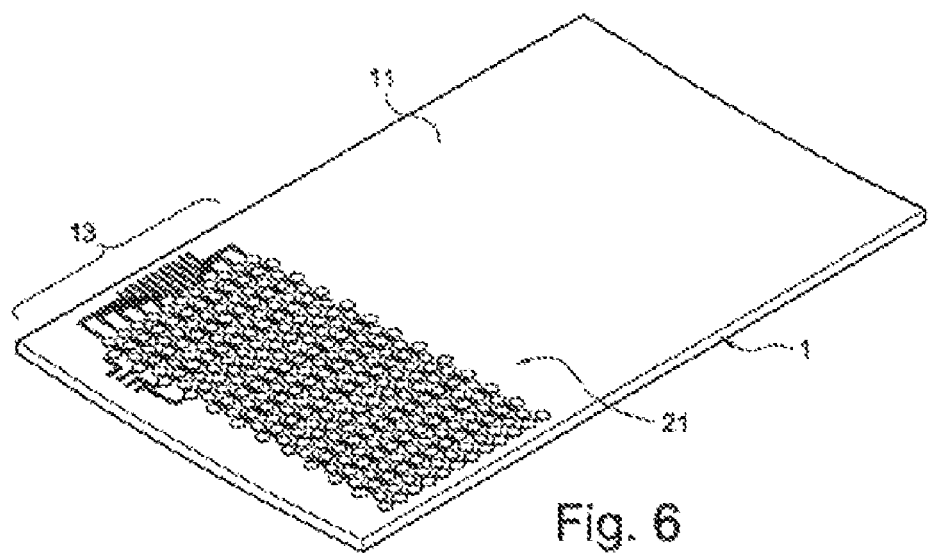
FIG. 6 is still another schematic, three-dimensional view showing an inducing capacitive touch circuit formed by etching the ITO layer shown in FIG. 4.

In one embodiment, the plastic film 1 can be made of a soft rubber film (as shown in FIGS. 1, 2 and 3). A plurality of touch members 121 for judging touch positions are formed on the outer surface 12 in the touch sense region 13. The touch members 121 and the outer surface 12 are one-piece. The touch circuit 2 may be an inducing capacitive touch circuit 21 (as shown in FIG. 6) made of transparent ITO, or may be a press touch circuit 22 made of conductive printing ink (as shown in FIG. 5). The ITO is coated on the inner surface 11 in the touch sense region 13 by a vacuum sputtering mode.

Figure 11:
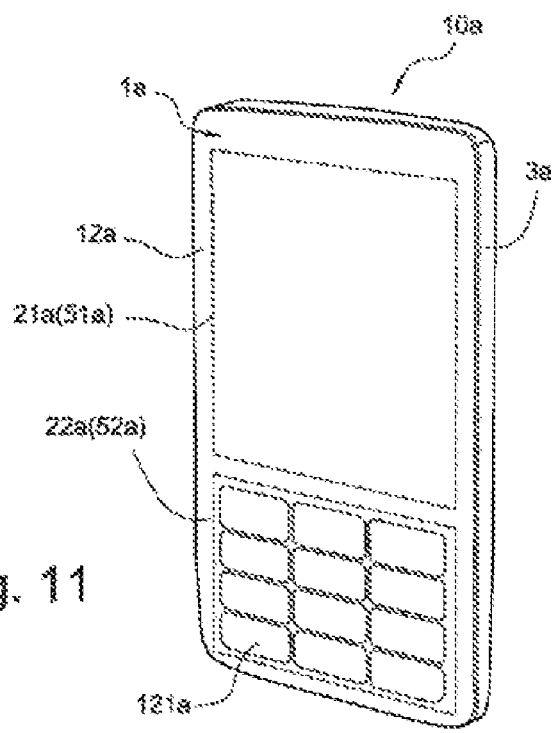
FIG. 11 is another schematic, three-dimensional view of an electronic device having an in-mould molding touch module, in accordance with another preferred embodiment of the present invention.

According to another embodiment, the in-mould molding touch module 10*a* (as shown in FIG. 11) includes a plastic film 1*a*, an inducing capacitive touch circuit 21*a*, a press touch circuit 22*a* and a molding rind 3*a*.

Figure 12:
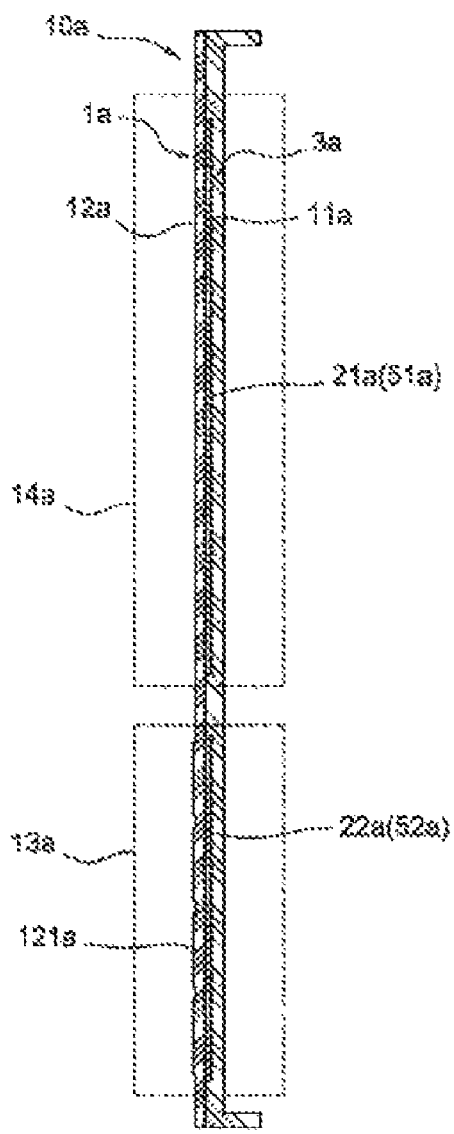
FIG. 12 is a schematic, crossed-view of the in-mould molding touch module in FIG. 11.
Figure 13:
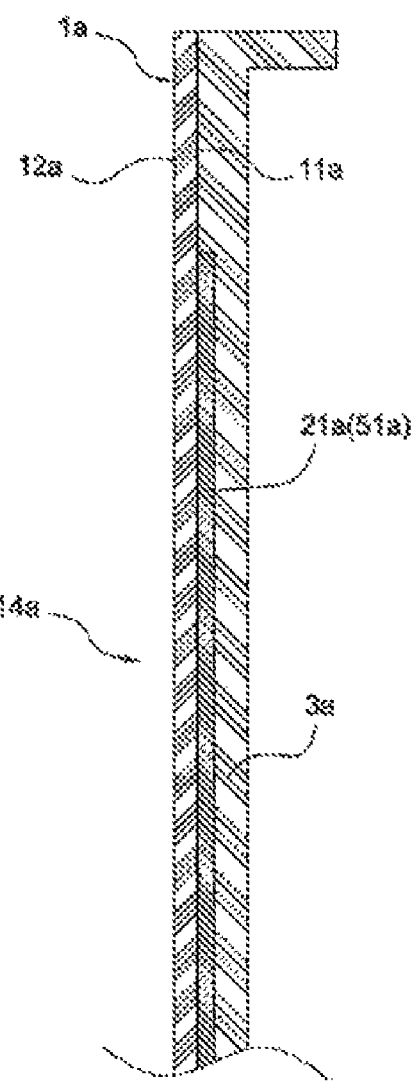
FIG. 13 is a part enlarged view of a first touch region shown in FIG. 12, showing an inducing capacitive touch circuit formed on an inner surface of a plastic film in the first touch region.

The plastic film 1*a* includes an inner surface 11*a* (as shown in FIGS. 12 and 13) and an outer surface 12*a* for handling and touching. A first region of the inner surface 11*a* and a first corresponding region of the outer surface 12*a* define a first touch region 14*a*, and a second region of the inner surface 11*a* and a second corresponding region of the outer surface 12*a* defines a second touch region 13*a*.

The inducing capacitive touch circuit 21*a* is made of transparent ITO and formed on the inner surface 11*a* in the first touch region (as shown in FIG. 13).

The press touch circuit 22*a* is made of conductive printing ink and formed on the inner surface 11*a* in the second touch region 13*a* (as shown in FIG. 3).

The molding rind 3*a* is integrated on the inner surface 11*a* by the in-mould injecting mode to contain the press touch circuit 22*a* for forming a one-piece body (as shown in FIG. 3).

A plurality of touch members 121*a* for judging touch positions are formed on the outer surface 12*a* in the second touch region 13*a* (as shown in FIG. 3). And the inducing capacitive touch circuit 21*a* is contained in the molding rind 3*a* (as shown in FIG. 13).

Figure 17:
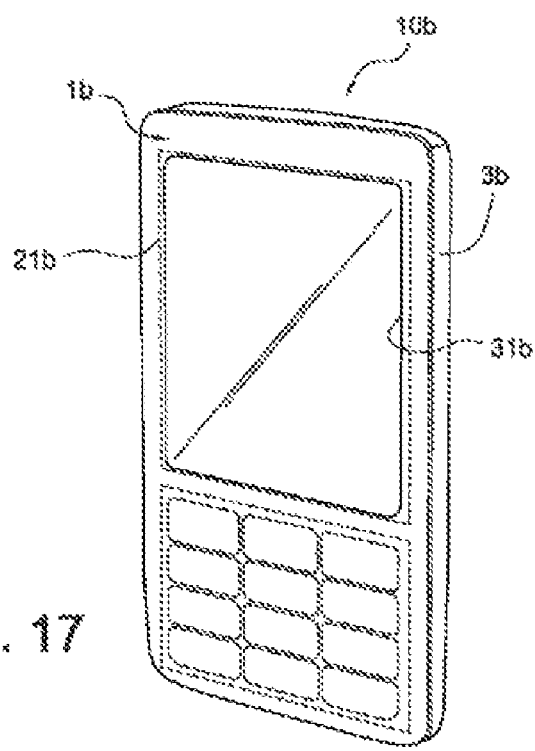
FIG. 17 is still another schematic, three-dimensional view of an electronic device having an in-mould molding touch module of still another preferred embodiment of the present invention.
Figure 18:
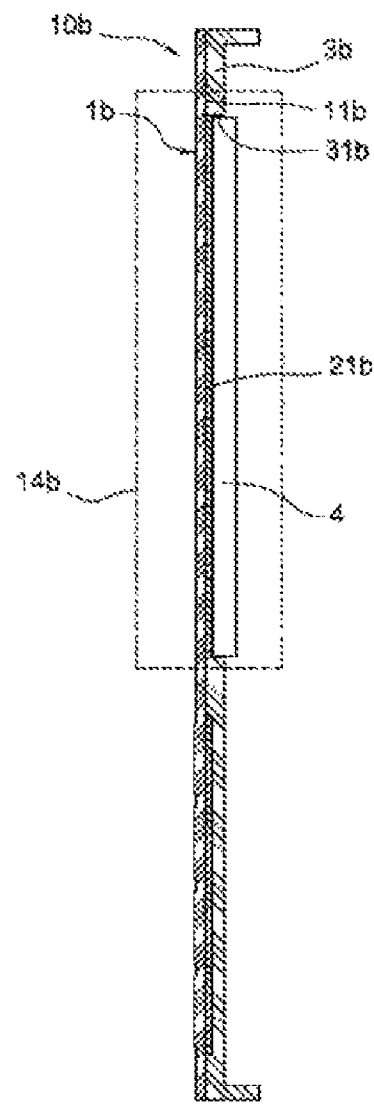
FIG. 18 is a schematic, crossed-view of the in-mould molding touch module of FIG. 17.
Figure 19:
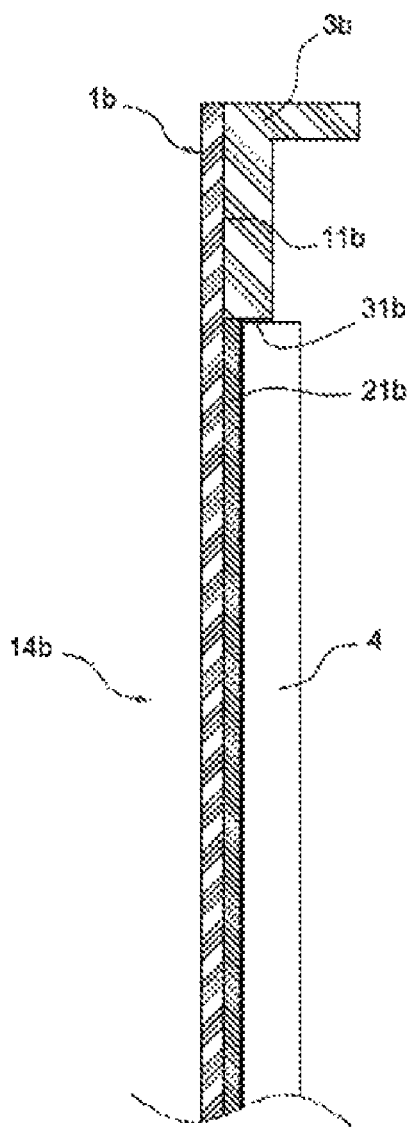
FIG. 19 is a part enlarged view of a first touch sense region shown in FIG. 18, showing a display unit configured in a window of a molding rind.

According to another embodiment, a window 31*b* (as shown in FIG. 17 to 19) is formed in the in-mould molding touch module 10*b* to expose the inducing capacitive touch circuit 21*b* on the inner surface 11*b* of the plastic film 1*b* in the first touch region. A display unit 4 is configured in the window 31*b*. The portion of the plastic film 1*b* corresponding to the first touch region 14*b* is transparent so that the display unit 4 can display images through the inducing capacitive touch circuit 21*b* and the plastic film 1*b*.

Therefore, the in-mould molding touch module 10*a* or 10*b* can serve as a touch panel having two different touch regions. The in-mould molding touch module has a thin thickness, and eliminates a ladderlike thickness and a gap arranged between the joint surfaces. Consequently, the in-mould molding touch module can avoid congregating the dust; and is prone to be thin.

A method for manufacturing the in-mould molding touch module 10 (as shown in FIG. 1 to FIG. 3), includes:

(1) providing a plastic film 1, the plastic film 1 including an inner surface 11 (as shown in FIG. 3) and an outer surface 12 for handling and touching. At least one region of the inner surface 11 and a corresponding region of the outer surface 12 define a touch area 13. In the second touch region 13, a plurality of touch members 121 for judging touch positions are formed on the outer surface 12.

Figure 4:
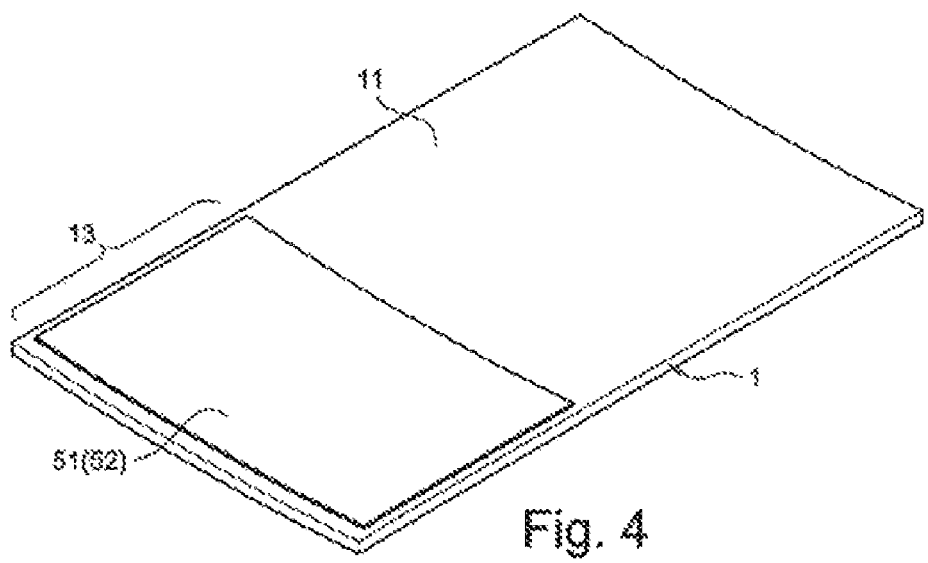
FIG. 4 is a schematic, three-dimensional view of the substrate, which has an ITO layer or a conductive printing ink coated thereon.

(2) coating a transparent ITO layer 51 on the inner surface 11 in the touch region 13 by a vacuum sputtering mode (as shown in FIG. 4). Preferably, the plastic film 1 is arranged in a vacuum sputtering device. The vacuum sputtering device may be an advanced low-temperature vacuum sputtering nano-manufacturing device in the industry. The vacuum sputtering device uses Ar ions to bombard an ITO target for bombarding atoms of the ITO target to deposit on the inner surface 11 of the plastic film 1 for forming a transparent ITO layer 51 coated on the plastic film 1. The transparent ITO layer 51 has an excellent conductive capability. Since the low-temperature vacuum sputtering technology can reduce a working temperature to 60 centigrade degrees, the plastic film 1 may have a high steady capability in the vacuum sputtering process.

Figure 7:
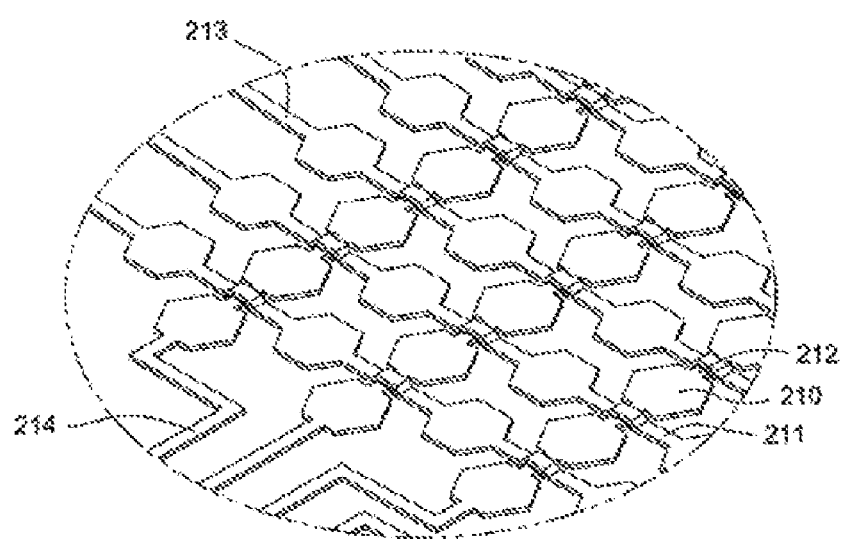
FIG. 7 is a part enlarged view of the inducing capacitive touch circuit shown in FIG. 6, showing the inducing capacitive touch circuit having a plurality of capacitor grids between each two adjacent interlaced reticular lines.

(3) exposing, developing and etching the ITO layer 51 to form a inducing capacitive touch circuit 21 (as shown in FIG. 6) being reticular on the inner surface 11 of the plastic film 1. The inducing capacitive touch circuit 21 forms a plurality of capacitor grids 210 (as shown in FIG. 7) between the interlaced reticular lines 211, 212. For user's finger touch the outer surface 12 of the plastic film 1 to cause the inducing capacitor grids 210 of the inner surface 11 of the touching location sensing sensitively and increasing the current to produce a current signal corresponding to the coordinate values, the reticular lines 211, 212 extend to for forming at least two outer terminals 213, 214 configured for electrically connecting to a controller through a flexible circuit or a lead for outputting the current signal.

Figure 8:
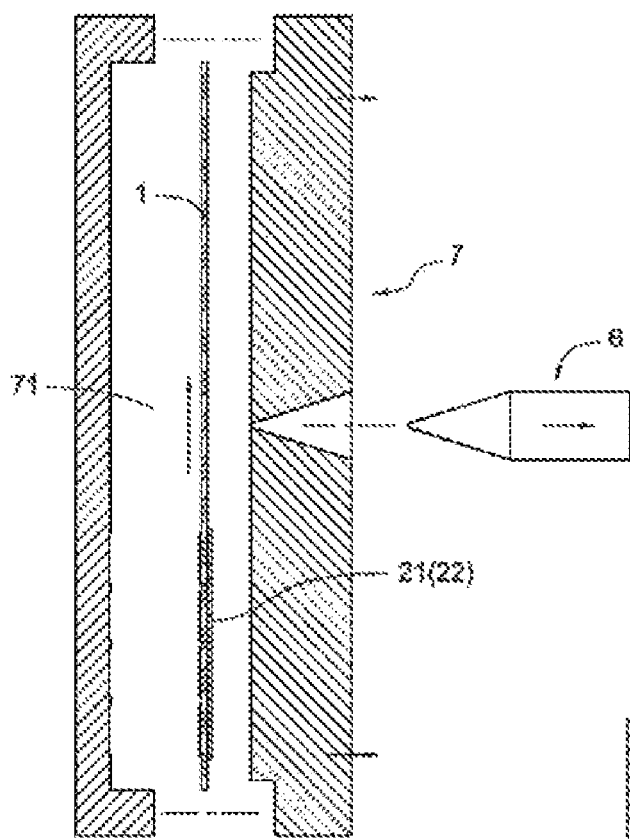
FIG. 8 is a schematic, crossed-view of the in-mould molding touch module shown in FIG. 2 performing an in-mould molding process, showing inserting the plastic film having the inducing capacitive touch circuit coated thereon into a cavity of an injecting device.
Figure 9:
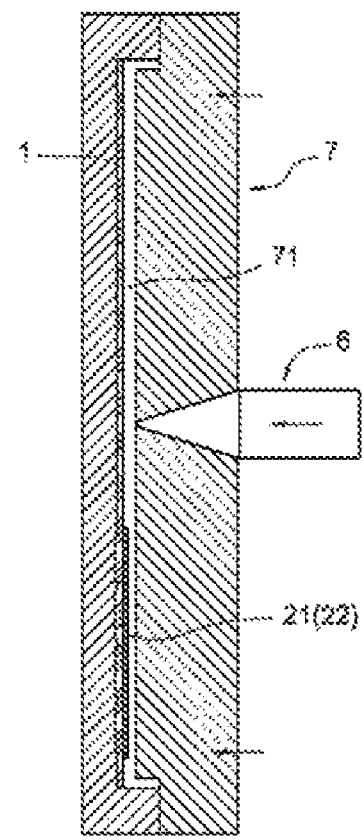
FIG. 9 is another schematic, crossed-view of the in-mould molding touch module shown in FIG. 2 performing the in-mould molding manufacturing process, showing closing the cavity and injecting molding material into the cavity.
Figure 10:
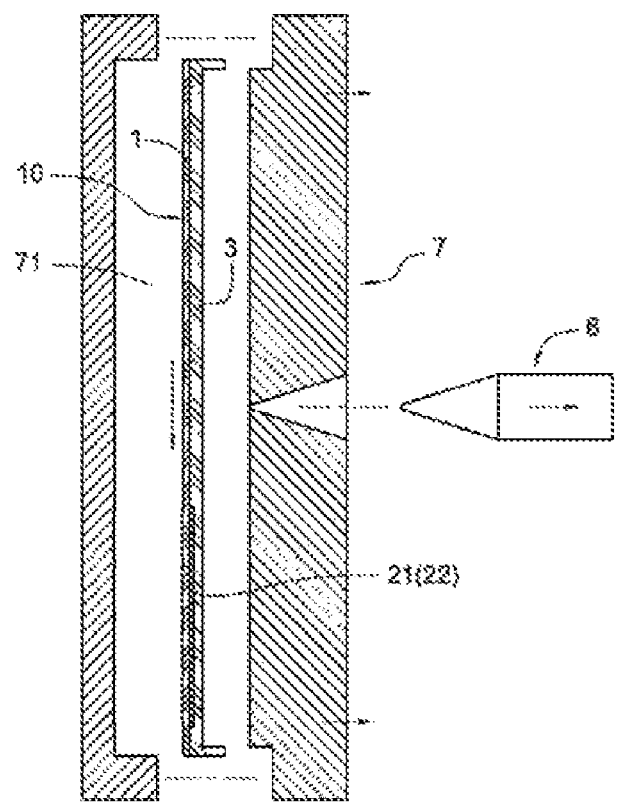
FIG. 10 is still another schematic, crossed-view of the in-mould molding touch module shown in FIG. 2 performing the in-mould molding manufacturing process, showing opening the cavity and taking a molding rind from the cavity.

(4) inserting the plastic film 1 having the inducing capacitive touch circuit 21 coated thereon into a cavity 71 (as shown in FIG. 8) of an injecting device 6 to be served as an inserter of the cavity 71. The injecting device 6 may be a common device for injecting melting plastic, and may include a mold 7 having the cavity 71 therein. The cavity 71 is corresponding to the shape of the in-mould molding touch module 10. The cavity 71 includes a space corresponding to the substrate 1, the inducing capacitive touch circuit 21 and the molding rind 3 for containing the plastic film 1 therein. Furthermore, the processing temperature of the injecting melting plastic of the injecting device 6 is approximately 250 to 300 centigrade degrees, and the temperature of the cavity 71 is generally controlled between 60 to 150 centigrade degrees. Thus the plastic film 1 can be made of a soft rubber film having a heat-resistance capability higher than the temperature in the injecting mold and the vacuum sputtering process, and the ITO layer has heat-resistance capability higher than the temperature in the injecting mold. Thus, the plastic film 1 and the inducing capacitive touch circuit 21 being contained in the cavity 71 can maintain a steadily invariability. At that time, the mold 7 is closed, and the molding material (generally be melting rubber) is injected into the cavity 71 (as shown in FIG. 9). Then the mold 7 is opened (as shown in FIG. 10) to form a molding rind 3 (as shown in FIGS. 1 to 3), which is integrated on the inner surface 11 of the plastic film 1 to contain the inducing capacitive touch circuit 21 therein for forming a one-piece body.

Another method for manufacturing the in-mould molding touch module 10 (as shown in FIG. 1 to FIG. 3), includes: (1) providing a plastic film 1 including an inner surface 11 (as shown in FIG. 3) and an outer surface 12 for handling and touching. At least one region of the inner surface 11 and a corresponding region of the outer surface 12 define a touch area 13. (2) coating a conductive printing ink film 52 on the inner surface 11 in the touch region 13 by a printing mode (as shown in FIG. 4). (3) exposing, developing and etching the conductive printing ink film 52 to form a press touch circuit 22 (as shown in FIG. 5). (4) inserting the plastic film 1 having the press touch circuit 22 coated thereon into a cavity 71 (as shown in FIG. 8) of an injecting device 6 to be served as an inserter of the cavity 71. After the mold 7 is closed (as shown in FIG. 9), molding materials are injected into the cavity 71 to form a molding rind 3 (as shown in FIG. 10), which is integrated on the inner surface 11 of the plastic film 1 to contain the press touch circuit 22 therein for forming a one-piece body.

In addition, we can employ the above method to select the plastic film 1 and form the touch sense members 121 on the outer surface 12 of the plastic film 1.

Thus a touch panel having a single press touch region is formed, and the method has a characteristic of thin design.

Another method for manufacturing the in-mould molding touch module 10a (as shown in FIG. 11 to FIG. 13), includes: (1) providing a plastic film 1 a including an inner surface 11a and an outer surface 12a for handling and touching. A first region of the inner surface 11a and a first corresponding region of the outer surface 12a define a first touch region 14a, and a second region of the inner surface 11a and a second corresponding region of the outer surface 12a defines a second touch region 13a.

(2) coating a transparent ITO layer 51 a on the inner surface 11a in the first touch region 14a by a vacuum sputtering mode.

(3) coating a conductive printing ink film 52a on the inner surface 11a in the second touch region 13a by a vacuum sputtering mode.

(4) exposing, developing and etching the ITO layer 51a and the conductive printing ink film 52a to form an inducing capacitive touch circuit 21a made of ITO 51a and a press touch circuit 22a made of conductive printing ink film 52a.

Figure 14:
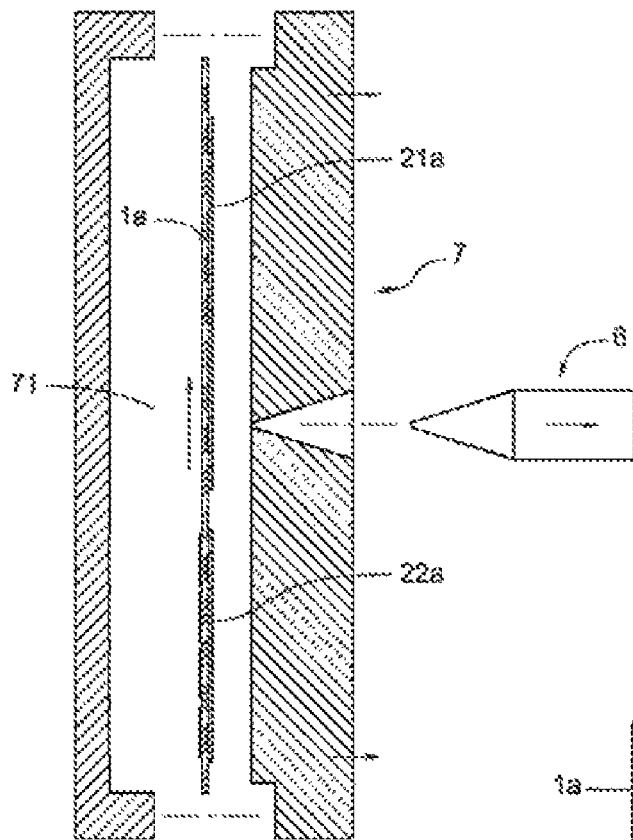
FIG. 14 is a schematic, crossed-view of the in-mould molding touch module shown in FIG. 12 performing an in-mould molding process, showing inserting the plastic film having the inducing capacitive touch circuit and a press touch circuit coated thereon into a cavity of an injecting device.
Figure 15:
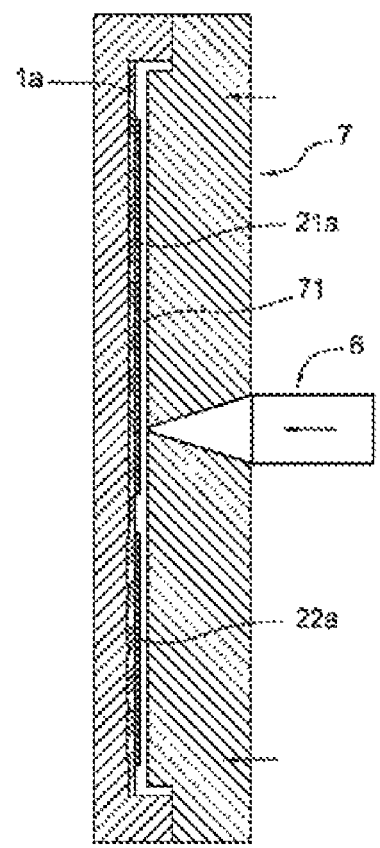
FIG. 15 is another schematic, crossed-view of the in-mould molding touch module shown in FIG. 12 performing the in-mould molding manufacturing process, showing closing the cavity and injecting molding material into the cavity.
Figure 16:
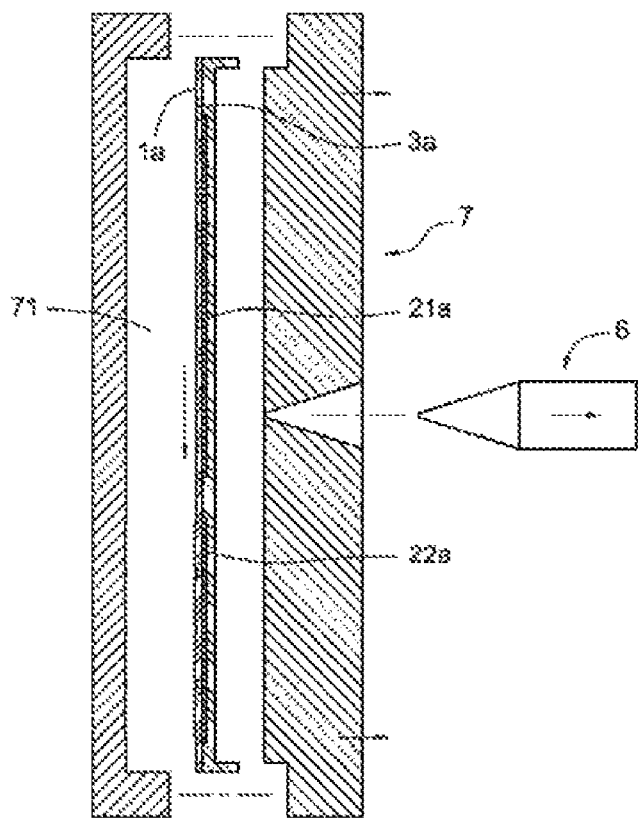
FIG. 16 is another schematic, crossed-view of the in-mould molding touch module shown in FIG. 12 performing the in-mould molding manufacturing process, showing opening the cavity and taking a molding rind from the cavity.

(5) inserting the plastic film 1a having the inducing capacitive touch circuit 21a and the press touch circuit 22a coated thereon into a cavity 71 (as shown in FIGS. 14 and 15) of an injecting device 6 to be served as an inserter of the cavity 71, and then injecting molding materials into the cavity 71 to form a molding rind 3a (as shown in FIG. 16). The molding rind 3a is integrated on the inner surface 11a of the plastic film 1a to at least contain the press touch sense circuit 22a therein for forming a one-piece body.

In addition, we can employ the above method to select the plastic film 1a and form the touch sense members 121a on the outer surface 12a of the plastic film 1.

Figure 20:
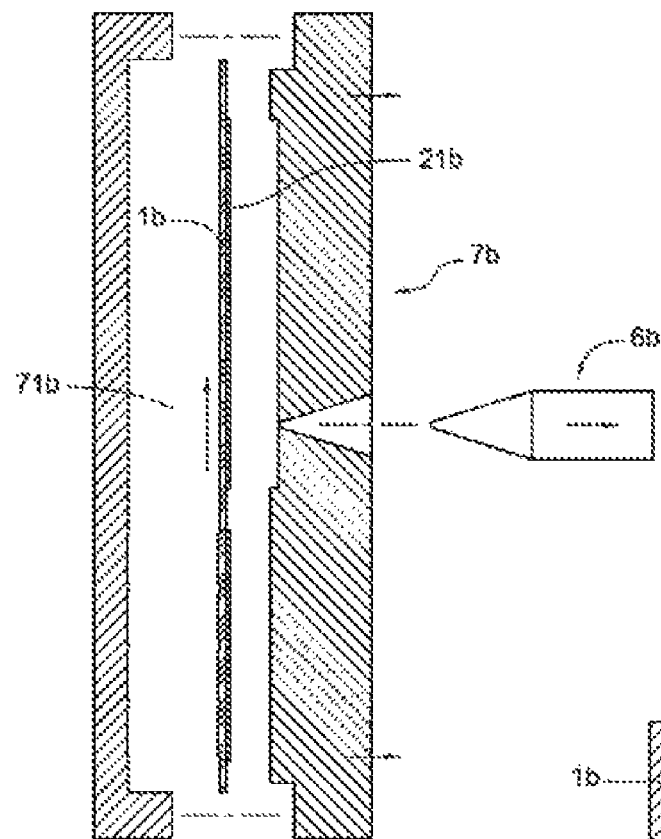
FIG. 20 is a schematic, crossed-view of the in-mould molding touch module shown in FIG. 18 performing an in-mould molding process; showing inserting a plastic film having the inducing capacitive touch circuit and a press touch circuit coated thereon into a cavity of an injecting device.
Figure 21:
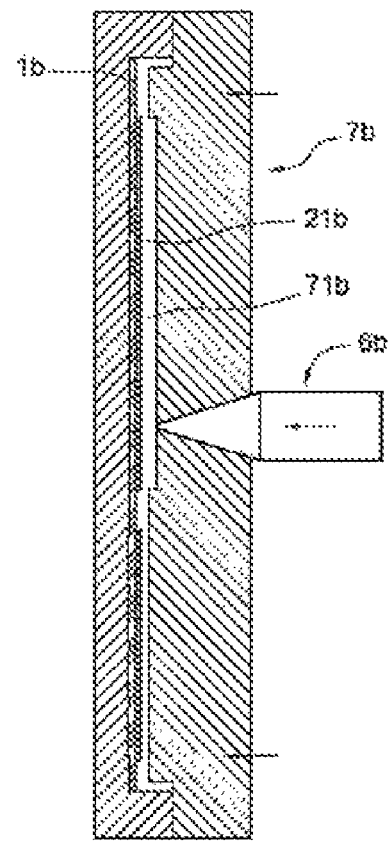
FIG. 21 is another schematic, crossed-view of the in-mould molding touch module shown in FIG. 18 performing the in-mould molding manufacturing process, showing closing the cavity and injecting molding material into the cavity.
Figure 22:
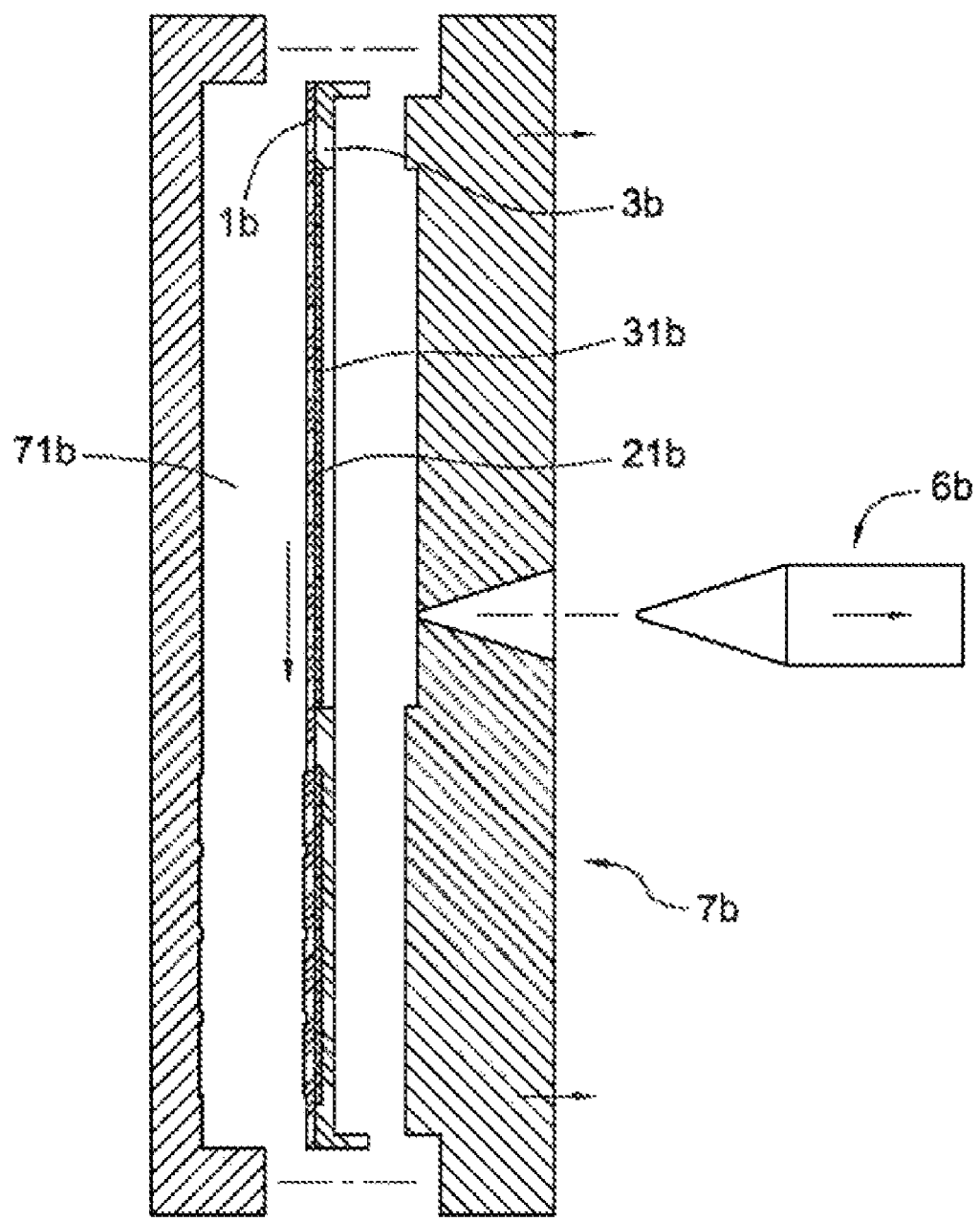
FIG. 22 is another schematic, crossed-view of the in-mould molding touch module shown in FIG. 18 performing the in-mould molding manufacturing process, showing opening the cavity and taking a molding rind from the cavity.

According to another method, the inducing capacitive touch circuit 21b (as shown in FIGS. 18 and 19) can be covered in the cavity 71b of an injecting device 6b (as shown in FIG. 20). After the mold 7b is closed (as shown in FIG. 21) and molding materials are injected into the cavity 71b. A window 31b is formed in the mold rind 3b to expose the inducing capacitive touch circuit 21b. The mold rind 3b can further contain the inducing capacitive touch circuit 21b therein for forming the one-piece body.

Therefore, in the method for manufacturing the in-mould molding touch module 10b, the display unit 4 can be configured in the window 31b to display images through the inducing capacitive touch circuit 21b and the transparent region of the plastic film 1b.

Thus a touch panel having a sense touch region and a press touch region can be formed, and the touch panel has a characteristic of thin design.

As described in the above, the plastic film 1, 1a or 1b coated with the inducing capacitive touch circuit 21, 21a or 21b and the press touch circuit 22 or 22a can be favorably inserted into the cavity 71, 71a or 71b to combine with the melting molding material. Furthermore, the plastic film 1, 1a or 1b may be made of a material, which can satisfy the heating resistance condition of the manufacturing processes.

Since the method employs the molding rind 3, 3a or 3b to contain the touch substrate 1, 1a or 1b by the in-mould injecting technology, the method is favorably performed in the injecting device having conditions of auto inputting material and outputting material. Therefore, the method can increase the auto producing capability.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims not to be limited by the illustrated embodiments.

What is claimed is:

1. A method for manufacturing an in-mould molding touch module having a touch area, comprising: (a) forming a touch circuit on the inner surface of a substrate; and (b) molding a molding rind molded on the substrate being an in-mold injected module to contain the touch circuit form a one-piece body; wherein the touch circuit is an inducing capacitive touch circuit, and the inducing capacitive touch circuit comprises a plurality of capacitor grids for sensing and producing a current signal in response to a touch, a plurality of interlaced reticular lines and at least two outer terminals for outputting the current signal; the capacitor grids are disposed between the interlaced reticular lines.

2. A method for manufacturing an in-mould molding touch module having a touch area, comprising: (a) forming a touch circuit on the inner surface of a substrate; and (b) molding a molding rind molded on the substrate being an in-mold injected module to contain the touch circuit form a one-piece body; wherein the touch circuit is an inducing capacitive touch circuit, and the step (a) further comprises a step of coating a transparent conductive layer on the inner surface of the substrate in the touch area by a vacuum sputter mode, and wherein the step (a) further comprises steps of exposing, developing and etching the transparent conductive layer sequentially to form the inducing capacitive touch circuit.

3. A method for manufacturing an in-mould molding touch module having a touch area, comprising: (a) forming a touch circuit on the inner surface of a substrate; and (b) molding a molding rind molded on the substrate being an in-mold injected module to contain the touch circuit form a one-piece body; wherein the touch circuit is a press touch circuit.

4. The method of claim 3, wherein the step (a) further comprises a step of coating conductive printing ink film on the inner surface of the substrate in the touch area by a printing mode.

5. The method of claim 4, wherein the step (a) further comprises steps of exposing, developing and etching the conductive printing ink film sequentially to from the press touch circuit.

6. A method for manufacturing an in-mould molding touch module having a touch area, comprising: (a) forming a touch circuit on the inner surface of a substrate; and (b) molding a molding rind molded on the substrate being an in-mold injected module to contain the touch circuit form a one-piece body; wherein the step (b) further comprises: inserting the substrate having the touch circuit coated thereon into a cavity of an injecting device and injecting molding material into the cavity to form the molding rind molded on the substrate.

7. The method of claim 6, wherein the processing temperature of the injecting melting substrate of the injecting device is 250 to 300 centigrade degrees.

8. The method of claim 6, wherein the temperature of the cavity is controlled between 60 to 150 centigrade degrees.

9. A method for manufacturing an in-mould molding touch module, comprising: (a) forming a first touch circuit on a first region of the inner surface of a substrate; (b) forming a second touch circuit on a second region of the inner surface of the substrate; and (c) molding a molding rind molded on the substrate being an in-mold injected module to contain the first touch circuit and the second touch circuit form a one-piece body, wherein the first touch circuit is an inducing capacitive touch circuit, and the inducing capacitive touch circuit comprises a plurality of capacitor grids for sensing and producing a current signal in response to a touch, a plurality of interlaced reticular lines and at least two outer terminals for outputting the current signal; the capacitor grids are disposed between the interlaced reticular lines.

10. A method for manufacturing an in-mould molding touch module, comprising: (a) forming a first touch circuit on a first region of the inner surface of a substrate; (b) forming a second touch circuit on a second region of the inner surface of the substrate; and (c) molding a molding rind molded on the substrate being an in-mold injected module to contain the first touch circuit and the second touch circuit form a one-piece body, wherein the first touch circuit is an inducing capacitive touch circuit, and wherein the step (a) further comprises a step of coating an transparent conductive layer on the first region of the inner surface of the substrate by a vacuum sputtering mode.

11. The method of claim 10, wherein the step (a) further comprises steps of exposing, developing and etching the transparent conductive layer sequentially to form the inducing capacitive touch circuit.

12. The method of claim 10, wherein the transparent conductive layer is made of ITO.

13. A method for manufacturing an in-mould molding touch module, comprising: (a) forming a first touch circuit on a first region of the inner surface of a substrate; (b) forming a second touch circuit on a second region of the inner surface of the substrate; and (c) molding a molding rind molded on the substrate being an in-mold injected module to contain the first touch circuit and the second touch circuit form a one-piece body, and the second touch circuit is a press touch circuit, wherein the step (b) further comprises a step of coating conductive printing ink film on the second region of the inner surface of the substrate by a printing mode.

14. The method of claim 13, wherein the step (b) further comprises steps of exposing, developing and etching the conductive printing ink film sequentially to from the press touch circuit.

15. A method for manufacturing an in-mould molding touch module, comprising: (a) forming a first touch circuit on a first region of the inner surface of a substrate; (b) forming a second touch circuit on a second region of the inner surface of the substrate; and (c) molding a molding rind molded on the substrate being an in-mold injected module to contain the first touch circuit and the second touch circuit form a one-piece body, wherein the step (c) further comprises: inserting the substrate having the touch circuit coated thereon into a cavity of an injecting device and injecting molding material into the cavity to form the molding rind molded on the substrate.

* * * * *